United States Patent [19]
Crookshanks

[11] B 3,982,233
[45] Sept. 21, 1976

[54] CORE MEMORY WITH IMPROVED SENSE-INHIBIT RECOVERY TIME

[75] Inventor: Rex John Crookshanks, Palos Verdes Estates, Calif.

[73] Assignee: Ampex Corporation, Redwood City, Calif.

[22] Filed: Feb. 19, 1974

[21] Appl. No.: 443,712

[44] Published under the second Trial Voluntary Protest Program on January 27, 1976 as document No. B 443,712.

[52] U.S. Cl. .................... 340/174 DC; 340/174 CR; 340/174 M; 340/174 DA; 340/174 AC
[51] Int. Cl.² ...................... G11C 7/02; G11C 11/06
[58] Field of Search .............. 340/174 AC, 174 DA, 340/174 DC, 174 CR, 174 M

[56] References Cited
UNITED STATES PATENTS

| | | | |
|---|---|---|---|
| 3,548,391 | 12/1970 | Perlman | 340/174 CR |
| 3,675,224 | 7/1972 | Ninomiya et al. | 340/174 DA |
| 3,774,181 | 11/1973 | Wells et al. | 340/174 AC |
| 3,824,569 | 7/1974 | Schuur | 340/174 DC |

*Primary Examiner*—Stanley M. Urynowicz, Jr.

[57] ABSTRACT

A three wire 3D core memory which utilizes the same balanced pairs of sense-inhibit conductors to conduct both high energy common mode inhibit currents and low energy differential mode core switching signals includes pairs of antiparallel Schottky diodes interconnecting the conductor pairs at symmetrical positions therealong intermediate the cores of each memory mat. As high energy common mode inhibit currents are generated small deviations from perfect symmetry of electrical characteristics along the sense-inhibit conductors results in the appearance of differential voltages which are substantial in comparison to switching signal voltages. The sense-inhibit recovery time required for dissipation of these spurious differential voltage signals before a memory read cycle can proceed consumes a substantial portion of a memory cycle for large stacks. The Schottky diodes substantially reduce this recovery time to greatly improve memory cycle time by limiting the differential voltages to the low threshold forward conduction voltage thereof and by appearing as transmission line discontinuities to break up differential voltage signals which remain after termination of an inhibit current into higher frequency harmonic components which are more rapidly attenuated. The Schottky diodes have no substantial effect upon the sensed output switching signals because the threshold forward bias voltage of the Schottky diodes is greater than the peak switching signal voltage.

24 Claims, 7 Drawing Figures

WITH DISCONTINUITY
FIGURE 7

WITHOUT DISCONTINUITY
FIGURE 6

CORE MEMORY WITH IMPROVED SENSE-INHIBIT RECOVERY TIME

BACKGROUND OF THE INVENTION

1. Field of the Invention

This invention relates to core memories having cores inductively coupled by balanced conductor pairs alternately carrying large currents and small differential switching signals, and more particularly to such core memories having circuit elements connected to the conductor pairs intermediate the cores of a bit position to limit differential voltages and provide a selectively operable discontinuity for improving sense-inhibit recovery time.

2. History of the Prior Art

A conventional 3D, three wire core memory includes a plurality of rectangular arrays of magnetic cores with each array representing one bit position. A plurality of orthogonal X and Y drive wires are inductively coupled to the cores of the arrays with each X drive conductor inductively coupling one corresponding row from each array and each Y drive conductor inductively coupling one corresponding column from each array. When partial select currents are passed through one Y drive wire and one X drive wire there is a coincidence of the two partial select currents at one core in each bit position with the driving force being sufficient to switch only the selected core at the coincidence points of the X and Y drive currents. A pair of senseinhibit conductors is provided for each bit position and inductively couples the cores thereof in a balanced manner with each sense-inhibit conductor passing through the array parallel to the Y drive line conductors and inductively coupling half of the cores in the bit position. If it is desired not to write a one into a selected core at a given bit position, partial select inhibit currents are driven in parallel through the two sense-inhibit conductors at the given bit position in opposition to the Y drive current, causing the algebraic sum of the currents at the selected core to be less than that required for switching.

The inhibit currents are typically on the order of several hundred milliamps and cause a substantial amount of electrical energy to be stored by the sense-inhibit line pairs. The time required for this energy to dissipate upon termination of an inhibit current is much greater than the 200–400 nanosecond switching time of a core, particularly in applications where the sense-inhibit lines inductively couple at least 8K cores. During a subsequent read cycle, selected X and Y read drive currents, which are opposite in polarity to the write drive currents, drive a selected core at each bit position in a manner tending to switch it in the opposite or read direction back to zero. If a given core already stores a zero before it is driven by coincident read currents very little flux is switched in the core and only a small noise voltage is induced on the inductively coupled sense-inhibit line. However, if a given selected core is in the one state of magnetization a substantial amount of flux is switched to the zero state and an output switching pulse (U1) having a typical peak voltage on the order of 13–40 millivolts is generated differentially across the sense-inhibit line pair. This U1 differential signal may be relatively small compared to the voltages which appear on the sense-inhibit lines as a result of the retained energy which must be dissipated following termination of an inhibit current. In order to minimize the recovery time, the sense-inhibit lines of each pair are connected together at one end and driven in parallel to provide substantially equal inhibit currents. Because of chosen symmetry, differential voltage components between the lines of a pair are smaller and dissipate more rapidly than the common mode voltage components of the signals which remain between the two lines after termination of the inhibit currents. The switching signal can thus be sensed differentially across the unconnected ends of a pair of sense-inhibit lines without waiting for total dissipation of the common mode electrical signals. Reading is typically delayed until the differential signals dissipate to a voltage level of about 5 millivolts which will not interfere with the U1 switching signal.

Because the sense-inhibit line pairs are driven in parallel with substantially identical currents, are threaded through an array in a balanced manner, are substantially equal in length, and are substantially equal in diameter it would be expected that the differential voltages appearing between a pair of sense-inhibit conductors would be quite small. However, because of normal tolerance deviations in the physical characteristics of the wires, normal tolerance variations in the manner of stringing the wires through the cores of the memory, small deviations in drive current magnitudes, and deviations caused by different magnetic memory states of the inductively coupled cores, differential voltages which are substantial with respect to the U1 switching signal do appear on the sense-inhibit line pairs as a result of the inhibit drive currents. At the high frequencies involved in core memory operations the sense-inhibit lines are relatively long with respect to the wavelength of differential voltage signals induced thereon and thus appear as transmission lines. As a result, periodic voltage pulses appear at the sensed terminals with a period tending to equal the propagation time for a voltage pulse to travel from the sensed terminals to the common terminals and back. These reflections can be reduced somewhat by providing transmission line resistive terminations at the sense-inhibit line terminals but cannot be eliminated because of imperfect impedance matching. In a typical 8K memory it takes at least 340 nanoseconds for these reflecting differential voltage pulses to be reduced to the level of 5 millivolts peak-to-peak. During this time interval the memory must stand idle and otherwise usable memory operation time is lost. This delay tends to impose greater restrictions on core memory operating speed than core switching time. As the number of words increases, this recovery time increases faster than the proportional increase in the number of words. As a result, manufacturing economies that result from manufacturing memories with more words per module tend to be more than offset by the slower memory operation which is dictated by this senseinhibit recovery time.

SUMMARY OF THE INVENTION

A core memory stack in accordance with the invention includes at least one array containing a plurality of toroidal magnetic memory cores, a drive circuit inductively coupled to switch a selected core in each array, a pair of balanced senseinhibit lines for each array inductively coupling half the cores in a given array with balanced, parallel inhibit currents in opposition to write drive signals at selected cores, and an electronic circuit physically connected to the sense-inhibit lines intermediate the core array with magnetic cores inductively coupled to the sense-inhibit line on each side of the circuit connection position. The circuit may include a pair of antiparallel low capacitance Schottky diodes interconnecting the two balanced sense-inhibit lines within the array. Because the relatively low forward bias voltage of the Schottky diodes provides a threshold greater than that required for detection of an output switching signal as a core is read, the circuit has negligible effect during a read operation. However, as parallel inhibit currents are passed through the pair of sense-inhibit lines during a write operation the diodes conduct as necessary to limit differential voltages to the forward bias voltages of the diodes at the connection position. Upon termination of the parallel inhibit currents, the diodes act as transmission line discontinuities in the form of short circuits for differential voltages in excess of the forward bias voltages and tend to break up differential voltage pulses remaining on the sense-inhibit lines after termination of the inhibit currents into higher frequency harmonics of the normally occurring voltage pulses. The higher frequency harmonics are more readily absorbed by the inductively coupled magnetic cores and the recovery time required for these differential voltage pulses to dissipate to a magnitude which is small in comparison to output switching signals generated by a read operation is substantially reduced. The frequency and recovery time for these differential voltage pulses tends to be dependent upon the length of the sense-inhibit line between discontinuities appearing thereon, whether the discontinuities are caused by sense-inhibit line terminations or circuits intentionally positioned intermediate a core array to create discontinuities. It thus becomes advantageous to position a plurality of circuit elements intermediate a single core array, first to limit differential voltages generated by inhibit currents and second, to increase the ringing frequency of differential voltage components remaining after termination of the inhibit currents.

Anti-parallel Schottky diode pairs interconnecting the balanced sense-inhibit line pairs at substantially equal distances therealong provide particularly advantageous circuit elements for improving sense-inhibit recovery time. The Schottky diodes have small capacitances and relatively low forward bias voltages to limit differential signals on the sense-inhibit lines to relatively small magnitudes without interfering with small amplitude output switching voltages. Schottky diodes are currently available with forward bias voltages in the range of 200 millivolts and it appears that Schottky diodes having even lower forward bias voltages may be available in the future. It is desirable that the forward bias voltage provide a threshold of the smallest amplitude which will permit error free detection of output switching currents generated when a core is read. Schottky diodes have the further advantage of a very small junction capacitance on the order of 1 picofarad and very short minority carrier life times on the order of 100 picoseconds. Furthermore, the parametric junction capacitance does not increase with forward bias voltage as in the case of a bipolar diode. As a result, Schottky diodes appear as nonlinear transmission line discontinuities to the high frequency differential pulses which appear on the sense-inhibit lines. This is in contrast to a bipolar diode which has a much higher forward bias voltage and a much larger parametric junction capacitance, which increases with forward bias voltage and which causes such a diode to appear as a nearly pure capacitance to the high frequency differential voltage signals rather than as a transmission line discontinuity.

BRIEF DESCRIPTION OF THE DRAWINGS

A better understanding of the invention may be had from a consideration of the following detailed description taken in conjunction with the accompanying drawings, in which.

DETAILED DESCRIPTION

Figure 1:
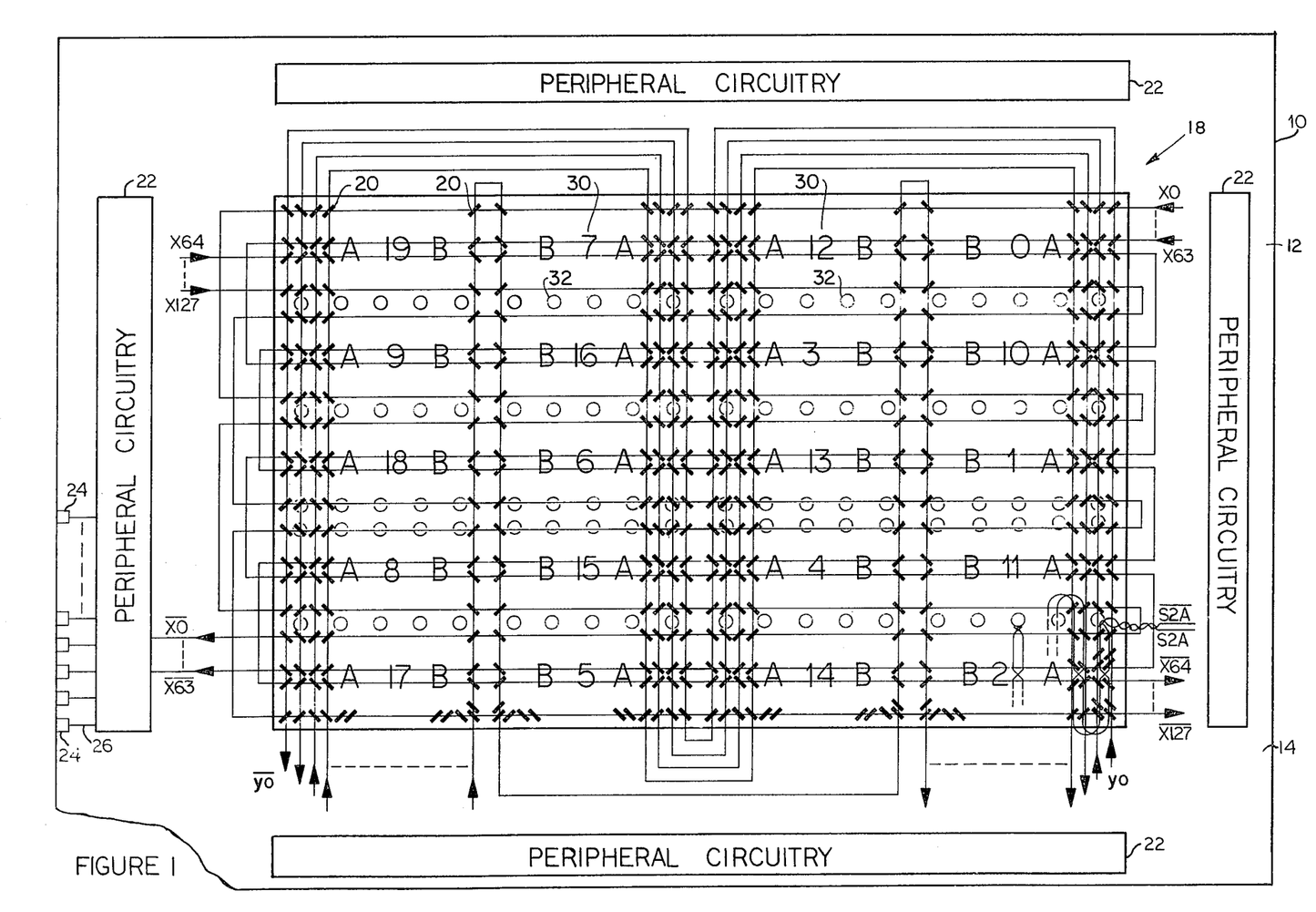
FIG. 1 is a schematic and block diagram representation of a planar core memory stack in accordance with the invention.
Figure 2:
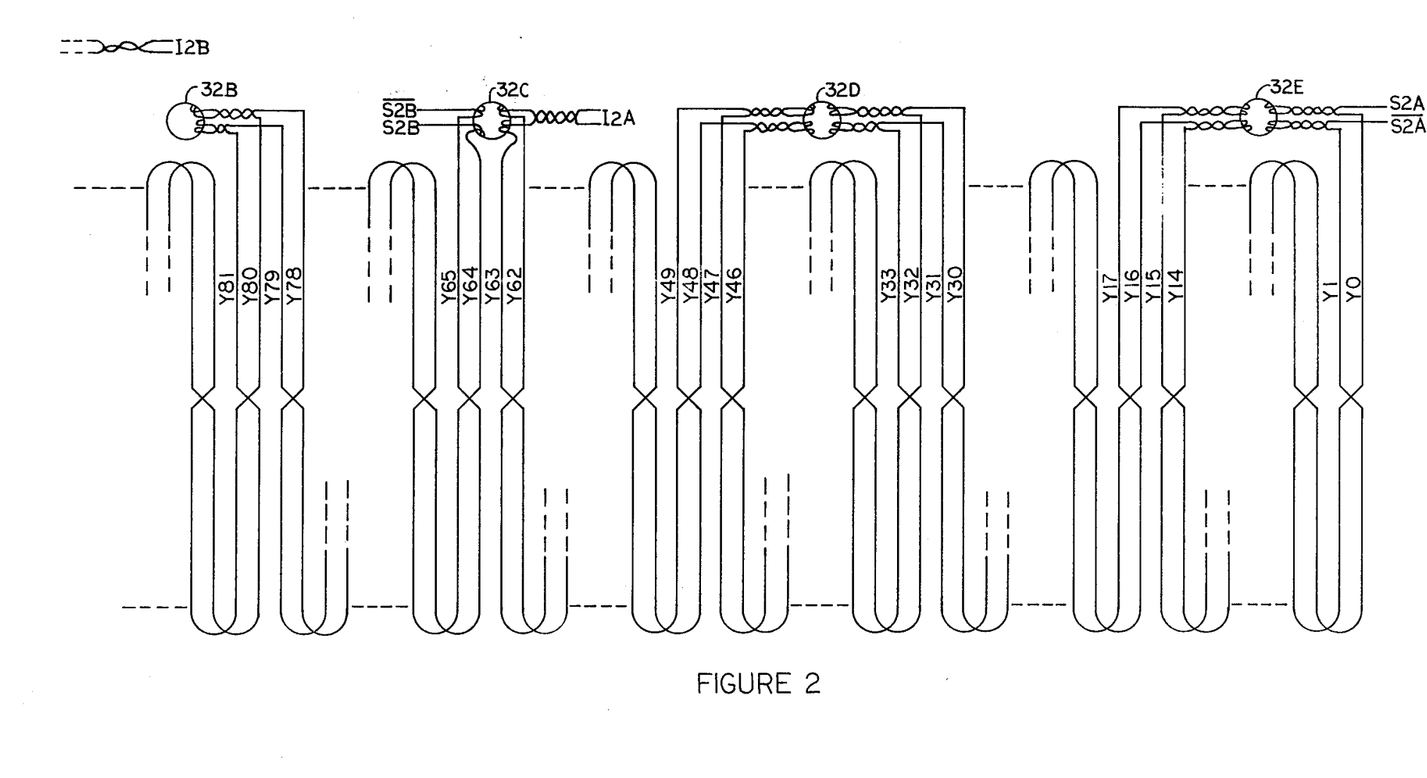
FIG. 2 is a schematic wiring diagram illustrating the manner in which sense-inhibit line conductor pairs pass through the cores of a bit position.
Figure 3:
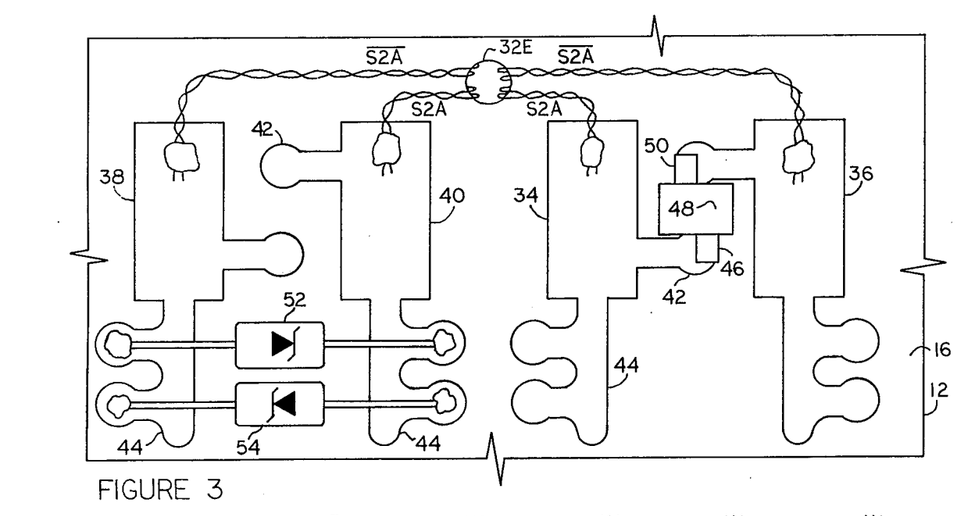
FIG. 3 is a schematic diagram illustrating the manner in which electronic circuitry may be connected to the senseinhibit line pairs intermediate a core array.

As shown in FIGS. 1, 2 and 3 a high density three wire 3D core memory 10 in accordance with the invention includes a circuit board 12 having a front side 14 and a back side 16, a 3 wire - 3D planar stack 18 of magnetic memory elements in the form of cores 20 mounted on the front side 14 of printed circuit board 12 interior to the periphery and peripheral circuitry 22 which is shown surrounding the stack 18 on the front side 14 of printed circuit board 12, but which may in general be mounted on the back side 16 or on separate printed circuit boards in a conventional manner. The peripheral circuitry 22 includes conventional memory circuitry such as drivers, decoders, sense amplifiers and interconnecting logic circuitry required for proper operation of a three wire 3D memory. Circuit elements of the peripheral circuitry may be conventionally interconnected by printed conductors on the circuit board 12 to each other, to driver and sense-inhibit circuitry as representatively illustrated by X drive lines X0 and X63, and to edge connectors 24 (only some of which are shown) providing external connection to other circuitry as representatively illustrated by printed conductors 26. The details of the specific arrangement of peripheral circuitry 22 and interconnecting printed conductors may be conventional in nature, and are not specifically shown for purposes of clarity. It will be appreciated, however, that circuitry for conventional operation of a three wire, 3D memory is contained within peripheral circuitry 22.

The planar stack 18 contains 16K words with 20 bits per word. Each bit position contains an array of 16K magnetic memory cores having 128 rows and 128 columns. The arrays 30 are arranged in a matrix having five rows and four columns and are labeled 0-19. Each of the arrays 30 is substantially identical in nature and as illustrated by bit position No. 2 in the lower righthand corner contains 128 rows and 128 columns of magnetic cores 20 arranged in a high density double-herringbone pattern. In the double-herringbone pattern the cores 20 are closely spaced along the vertical Y axis or column direction with the cores in two adjacent columns being similarly oriented to form column pairs and the cores in adjacent column pairs being oppositely oriented. A reversal of core orientation occurs once along each column with the cores in rows 0–63 being oriented in first direction and the cores of corresponding columns being oppositely oriented in rows 64–127.

A Y drive conductor is threaded to inductively couple a corresponding column of cores from each of the 20 bit positions in the stack 18. For instance, the Y0 column conductor begins at terminal end Y0 at bit position 2 in the lower righthand corner of stack 18, extends vertically upward to inductively couple one 128 core column from each of the bit positions 2, 11, 1, 10 and 0, completes a 180° turn to extend vertically downward coupling a similar column from each of the bit positions 12, 3, 13, 4 and 14 in succession, makes a second 180° rotation before extending upward to inductively couple a column of cores in each of the bit positions 5, 15, 6, 16 and 7 in succession, and then makes a final 180° rotation to extend downward to couple a column of cores in each of the successive bit positions 9, 19, 18, 8 and 17 before terminating at the sink end Y0 adjacent bit position 17. Additional Y drive conductors pass through the matrix of bit positions, inductively coupling one column of cores in each bit position beginning with conductor Y1 adjacent conductor Y0 and progressing through successive adjacent columns to Y conductor Y127. As the core orientation for adjacent column pairs is periodically reversed, the termination polarity for adjacent row pairs of Y drive conductors is also reversed. For instance, the drive end for Y conductors Y0 Y1, Y4 Y5, Y8 Y9 . . . are positioned adjacent bit position 2 with their opposite sink ends positioned adjacent bit position 17 while the drive ends of Y conductors Y2 Y3, Y6 Y7, Y10 Y11 . . . have their drive end terminals positioned adjacent bit position 17 and their sink end terminal positioned adjacent bit position 2.

X drive conductors 0–127 each inductively couple a corresponding row of cores from each of the 20 bit positions. Row conductors X0–X63 have their drive end terminals adjacent bit position zero in the upper righthand corner of the stack 18 and pass through successive bit positions to exit the stack at the sink ends adjacent bit position 17. The cores in row positions 64–127 are oppositely oriented from those in row positions 0–63 and are driven in an opposite direction with the drive end terminals of X line conductors X64–X127 beginning at bit position 19 and passing successively through the stack 18 to exit with the sink end terminals being adjacent bit position 2.

A single core from each bit position is selected for switching by passing a partial select current through one Y drive wire and one X drive wire. The single core in each bit position which lies at the intersection of the chosen X and Y drive wires receives a coincident current inducing a full switching magnetomotive force tending to switch the core in the driven direction while all other cores in the row and column of the selected core receive only a partial select current which is typically half of the full select current and which is insufficient to cause the cores to switch. Writing is accomplished by driving X and Y drive currents from the sink end to the drive end. The wiring and core orientation patterns are carefully selected to permit any write polarity Y drive current to be coincident with any selected write polarity X drive current at the core common thereto in each bit position. These write drive currents tend to switch the selected common core to a "1" state of magnetization. Similarly, opposite polarity read drive currents are coincident at the selected common core in each bit position and tend to drive the selected cores to the opposite "read" or "0" state of magnetization.

During the course of a read operation all selected cores are driven toward the 0 state of magnetization and an output switching pulse U1 having a peak amplitude on the order of 13–40 millivolts is generated whenever a core which was previously in the 1 state switches to the 0 state. However, the switching of a selected core at a given bit position to the 1 state during a write operation may or may not be desired, depending upon the information content of data which is being stored. In a three wire 3D memory, sense-inhibit wires which are separately controllable for each bit position are inductively coupled to the cores thereof to permit the passage of an inhibit current which is substantially equal to and opposite in polarity to the Y drive current. The algebraic sum of the currents at a selected core in a given bit position receiving an inhibit current thus equals only the partial select X drive current and is insufficient to switch the core. Such a core then remains in the 0 state at the end of a write operation. The inductively coupled X and Y drive wires and sense-inhibit conductors thus permit selective switching of the cores in the bit position arrays and sensing of output voltage signals generated by selectively switched cores.

While the X and Y drive wires are connected to the stack 18 in a 3D 16K × 20 configuration, each bit position is divided in half and the sense-inhibit lines are connected as a 8K × 40 configuration. The cores of each bit position which receive column wires Y0 through Y63 receive one set of senseinhibit conductors and are labeled Part A in FIG. 1 while the cores which are inductively coupled by Y drive wires Y64 through Y 127 receive a second pair of sense-inhibit lines and are labeled Part B in FIG. 1. The sensed outputs of one A and one B set of sense-inhibit wires, which need not be in the same physical bit position are logically ORed by peripheral circuitry 22 in a manner causing the memory 10 to appear as a 16K × 20 memory to external circuitry. The sense-inhibit line pairs must be passed through the bit positions parallel to the Y drive lines in a manner permitting inhibit currents passing from the common terminal thereof toward the differential sense terminals S and $\overline{S}$ to oppose the Y drive currents at all cores in each bit position. For bit positions 11, 4, 15, 8, 2, 14, 5 and 17 the sense-inhibit line pair enters the respective portion of the respective bit positions at the upper righthand corner thereof passes down through the columns in a parallel adjacent pair to cross between rows 63 and 64 and continues through to the bottom of the respective bit position pair. The sense-inhibit line pair is then rotated through 180° and crossed before being threaded upwardly through the lower 64 rows of the two adjacent columns in the bit position. The two wires are again crossed between rows 63 and 64 and continued through the remainder of the column pairs to be again rotated 180° and crossed as they are threaded downwardly through the next pair of columns. The sense-inhibit wires are passed back and forth in this manner until they have inductively coupled all 8K cores in the respective bit position portion. For bit position 2 the S2A sense-inhibit wire enters the bit position at the intersection of column Y0 and row X0 while the $\overline{S2A}$ sense-inhibit wire enters the bit position at column Y1 row X0. Sense-inhibit wire S2A exits the bit position at column 62 while sense-inhibit wire $\overline{S2A}$ exits the bit position at column Y63. The inhibit ends are soldered together as they exit the stack at columns Y62 and Y63 and connected to an inhibit current driver in peripheral circuitry 22. The cores in the B portion of bit position 2 are inductively coupled by sense-inhibit wires S2B and $\overline{S2B}$ in a manner substantially identical to the coupling of the A portion by sense-inhibit wires S2A and $\overline{S2A}$. Sense-inhibit wires S2A, S2B and S2B enter the bit position at columns Y64 and Y65 respectively and exit at their inhibit ends at column positions Y126 and Y127 respectively. For bit positions 0, 12, 7, 19, 10, 3, 16, 9, 1, 13, 6 and 18 the sense-inhibit wires are rotated 180°, permitting the wires to enter and exit the bit position portions at the lower row thereof instead of the upper row.

Five apertures 32 are provided for each bit position. These apertures provide communication through the printed circuit board 12 between the front side 14 and the back side 16 and have a diameter of at least 0.050 inch. These apertures, which are labeled 32A–32E for bit position 2, receive loops of sense-inhibit conductor wire as shown in greater detail in FIG. 2. As each sense-inhibit conductor is strung through a bit position portion, a loop of wire approximately 3 inches long is periodically formed at the side of the bit position where the sense-inhibit wire enters and terminally exits. This loop of wire is passed through one of the apertures 32A–32E for connection to circuitry on the back side 16 of circuit board 12. In the arrangement shown in FIG. 2 five loops are formed in each sense-inhibit wire and passed through one of the holes 32. A first loop is formed in sense-inhibit wire S2A at the sensing end prior to entry into the bit position 2A at column Y0. This loop is passed through aperture 32E. A second loop is formed between columns Y14 and Y16 and passed through aperture 32E, a third loop is formed between columns Y30 and Y32 and passed through aperture 32D, a fourth loop is formed between columns 46 and 48 and passed through aperture 32D and a fifth loop is formed between column 62 and the I2A inhibit connection and passed through aperture 32C. Five loops are similarly formed in sense-inhibit wire S2A with the first loop being formed between the sense end termination and the entry into column position Y1, with the second loop being formed between columns Y15 and Y17, the third loop being formed between columns Y31 and Y33, the fourth loop being formed between columns Y47 and Y49, and the fifth loop being formed between column I63 and ISA inhibit line terminal where the S2A and $\overline{S2A}$ sense-inhibit lines are connected together. The first and second loops of sense-inhibit line $\overline{S2A}$ are passed through aperture 32E, the third and fourth loops are passed through aperture 32D, and the fifth loop is passed through aperture 32C. In a similar manner five loops are formed in each of the sense-inhibit lines S2B and $\overline{S2B}$ for the B portion of bit position 2. The first loops pass through aperture 32C, the second and third loops pass through aperture 32B, and the fourth and fifth loops pass through aperture 32A.

As illustrated in FIG. 3 two pairs of solder pads 34, 26 and 38, 40 are provided on the back side 16 of printed circuit board 12 adjacent each aperture 32 as representatively illustrated for aperture 32E. Solder pad 34 receives the first loop of sense-inhibit wire S2A, both portions of which are bonded to the solder pad 34 with the excess being cut off. Similarly, both pads of the first loop in sense-inhibit wire $\overline{S2A}$ are bonded to pad 36, the second loop of conductor $\overline{S2A}$ is bonded to pad 38 and the second loop of S2A is bonded to pad 40. In each case excess wire in the loop is trimmed. These circuit connections of the various loops provide the means by which the sense-inhibit wires are connected to non-core circuitry intermediate a bit position with the sense-inhibit wires being inductively coupled to magnetic cores on both sides of at least one of the loops. Because the corresponding first through fifth loops of the S2A and $\overline{S2A}$ sense-inhibit lines occur at corresponding physical positions within the bit position, the electrical wire length between corresponding adjacent pairs of loops is substantially equal. That is, the electrical distance between the first and second loop of wire S2A is substantially equal to the electrical distance between the first and second loop of wire $\overline{S2A}$. In addition, in this arrangement the loops are substantially equally spaced along each sense-inhibit line so that the electrical distance between the first and second loop is substantially equal to the electrical distance between the second and third loop on each sense-inhibit line.

As shown in FIG. 3 each solder pad 34, 36, 38 and 40 is electrically connected to both a beam lead pad 42 and a discrete device pad 44 suitably shaped to receive two discrete device terminals. In a preferred circuit arrangement a beam lead 46 of semiconductor chip 48 is connected to a beam lead pad 42 of solder pad 34 and a second beam lead 50 of chip 48 is connected to a beam lead pad 42 of solder pad 36. The chip 48 is an integrated circuit chip containing a pair of anti-parallel low capacitance Schottky diodes electrically coupled between beam leads 46 and 50. A pair of diodes is considered to be connected in an antiparallel configuration when the anode of each is connected to the cathode of the other.

Schottky diode beam lead chips can be purchased from Hewlett-Packard with junction capacitances below 2 picofarads and as low as 1 picofarad and threshold forward bias voltages as low as 200 millivolts at 1 milliamp and minority carrier life time as short as 100 picoseconds. These Schottky diodes conduct components of signals appearing thereacross which have a voltage in excess of the 200 millivolt forward conduction threshold. Furthermore, because of the low parametric junction capacitance of these diodes they provide an impedance which is more resistive than reactive to the dominant frequency components of the differential noise signals. The Schottky diodes thus induce very little current-voltage phase shift in the dominant frequency components of differential signals appearing thereacross. Frequency components of the differential signals which are sufficiently high to cause the Schottky diodes to appear predominantly reactive are much more rapidly attenuated and have no substantial effect on the sense-inhibit recovery time.

As an alternative circuit arrangement pairs of discrete Schottky diodes may be connected in anti-parallel fashion between pairs of discrete element pads 44 as illustrated for solder pads 38 and 40. A first Schottky diode 52 is connected to conduct current from solder pad 38 to solder pad 40 and a second discrete Schottky diode is connected to conduct current from the solder pad 40 to solder pad 38. It will be appreciated that both beam lead and discrete circuit packages need not be accommodated and that only one pair of diodes need be connected between each pair of pads 34, 36 or 38, 40 and that either the discrete pads 44 or the beam lead pads 42 may be eliminated.

As alternative mounting techniques, antiparallel Schottky diode pairs such as beam lead pairs 48 may be mounted on the front side 14 of printed circuit board 12 between adjacent bit positions. In one arrangement the diode pairs may be mounted on tiny alumina substrates 55 (see FIG. 1) which are in turn mounted on the front side 14 of printed circuit board 12 at approximately the location where a hole 32 would be located if the diodes were mounted on the back side 16 as described above. The Y drive wires would then pass over the top of the substrate 55 and diodes mounted thereon.

Figure 4:
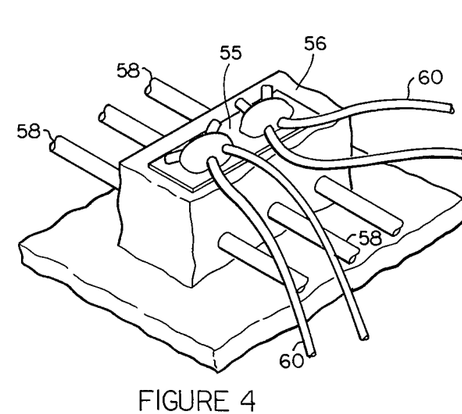
FIG. 4 is a fragmented perspective view, greatly enlarged, of an arrangement for mounting circuit elements intermediate a bit position on the same side of a printed circuit board as the cores of the bit position.

In a somewhat different arrangement shown in FIG. 4, the substrate 55 may be mounted on a puncturable bridge 56 which is in turn mounted on the front side 14 of printed circuit board 12. Y drive wires 58 are passed right through the bridge 56 and sense-inhibit conductors 60 are bonded to the substrate 55 atop bridge 56.

Figure 5:
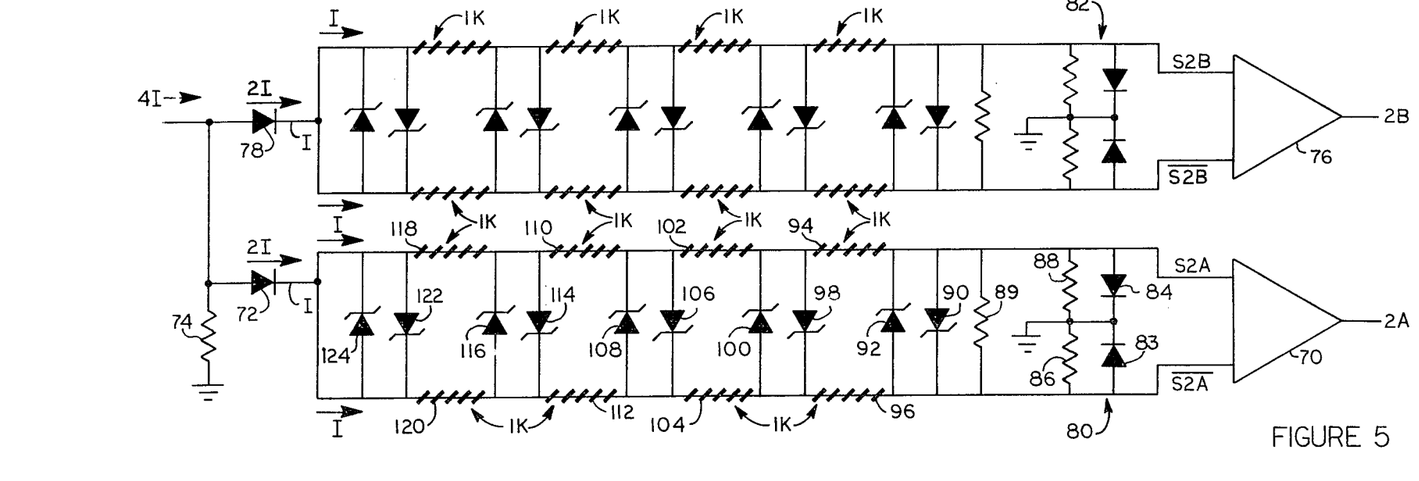
FIG. 5 is a schematic circuit diagram illustrating the sense-inhibit circuit for a given bit position.

A simplified circuit diagram for the sense-inhibit lines of bit position 2 is illustrated in FIG. 5. Sense-inhibit line pair S2A and $\overline{S2A}$ is connected at the sensing end to opposite input terminals of a differential amplifier 70 and each half thereof passes through four groups of 1,000 cores each before being connected together to form an inhibit terminal I which is connected to the cathode of an isolation diode 72. The anode of diode 72 is connected to a resistor 74 and also to an inhibit current driver source (not shown). Similarly, sense-inhibit lines S2B and $\overline{S2B}$ are connected to the opposite input terminals of a differential amplifier 78 and each passes through four groups of 1K cores each before being connected together to form an inhibit terminal which is connected to the cathode of a diode 78. The anode of diode 78 is connected to the inhibit current driver and also to resistor 74 and the anode of diode 72. The terminal of resistor 74 which is opposite diodes 72, 78 is connected to ground.

Substantially identical termination networks 80, 82 are provided adjacent the inputs to the sense amplifier 70, 76 respectively. Termination network 80 includes diodes 83 and 84 and resistors 86, 88 and 90. Diodes 83 and 84 have their anodes connected to $\overline{S2A}$ and S2A respectively and their cathodes connected to ground. Resistors 86 and 88 are connected in parallel with diodes 83 and 84 respectively. Diodes 83 and 84 provide a low impedance path to ground for the relatively large inhibit currents and protect the amplifier 70 by limiting the common mode voltages to the forward bias voltage of diodes 83, 84. Resistors 86, 88 and 89 are matched to the transmission line characteristics of the sense-inhibit wires S2A and $\overline{S2A}$ and provide as nearly a matched termination as possible to provide a resistive path to ground for common mode electrical signals and a resistive path between the sense-inhibit lines for differential mode electrical signals. The first pair of anti-parallel Schottky diodes 90, 92 is located between the termination network 80 and the entry of the sense-inhibit lines S2A and $\overline{S2A}$ into the cores of the second bit position and physically located in close proximity to the magnetic cores. These diodes interconnect the first loops of the two sense-inhibit lines. Beyond the first diode pair 90, 92 the sense-inhibit lines S2A and $\overline{S2A}$ are each threaded through a group of magnetic cores 94, 96 respectively each containing 1,024 cores. A second pair of anti-parallel Schottky diodes 98, 100 interconnects the sense-inhibit lines S2A, $\overline{S2A}$ between the second loops thereof which are positioned between the first groups of magnetic cores 94, 96 and second groups of 1,024 magnetic cores 102, 104 respectively. The Schottky diodes 98, 100 are physically positioned in close proximity to the magnetic cores of the second bit position to limit the physical length of the second loops and also the total length of the sense-inhibit lines S2A and $\overline{S2A}$. Inasmuch as the sense-inhibit lines S2A and $\overline{S2A}$ are inductively coupled to magnetic cores of the second bit position on either side of the second loop position at which the second pair of anti-parallel diodes 98, 100 are coupled to the sense-inhibit lines, the Schottky diodes 98, 100 are electrically coupled intermediate or within the core array of the second bit position at equivalent or symmetrical points along the pair of sense-inhibit wires S2A and $\overline{S2A}$. As explained above the anti-parallel pairs of diodes intermediate a bit position should be physically located in close proximity to the bit position and may be physically positioned on the opposite side of a circuit board near the bit position to which they are related. A third pair of anti-parallel Schottky diodes 106, 108 interconnects the sense-inhibit lines S2A, $\overline{S2A}$ at equivalent or symmetrical points therealong at third loops formed therein between third groups of 1,024 magnetic cores 110, 112 and the second groups 102, 104 respectively. A fourth pair of anti-parallel Schottky diodes 114, 116 interconnects the sense-inhibit lines S2A, $\overline{S2A}$ at fourth loops thereof positioned between fourth groups of 1,024 magnetic cores 118, 120 and the third groups 110, 112 respectively. A fifth pair of anti-parallel Schottky diodes 122, 124 interconnects the sense-inhibit lines S2A, $\overline{S2A}$ at fifth loops therein physically positioned adjacent the No. 2 bit position in close proximity to the cores 118, 120.

While the first through fifth pairs of anti-parallel diodes are physically positioned at substantially uniform intervals throughout the bit position, other positioning arrangements will occur to those skilled in the art. For instance, the number of cores in the groups of cores between two pairs of anti-parallel diodes may be different from the number of cores between a different two pairs of anti-parallel diodes. In addition, additional or fewer pairs of anti-parallel diodes may be positioned along a pair of sense-inhibit wires. As an example, it may be desirable to remove the second and fourth pairs of Schottky diodes and the fifth pair of Schottky diodes will have no appreciable effect if the inhibit terminal point at which the two sense-inhibit conductor halves S2A, $\overline{S2A}$ and S2B, $\overline{S2B}$ are connected together is physically close to the mat position. Experiments have indicated that as the number of cores and the sense-inhibit line length between adjacent pairs of Schottky diodes is reduced, the additional reduction in sense-inhibit recovery time resulting from the use of an additional pair of diodes becomes less significant. A determination must be made for each memory configuration to decide at what point the successively smaller improvements in sense-inhibit recovery time do not economically justify the addition of another anti-parallel pair of diodes.

During the write cycle an inhibit driver provides four times the required inhibit current to the sense-inhibit lines of each bit position into which a zero is to be written. This current divides with twice the required inhibit current passing through each of the isolation diodes 72 and 78 and then divides again with the inhibit current passing through each of the sense-inhibit wires S2A, $\overline{S2A}$, S2B and $\overline{S2B}$. Because of the rapid fall time that must be afforded the inhibit currents upon termination of a read-write cycle in order to attain efficient memory operation the fall time is not long with respect to the propagation time along the sense-inhibit wires and a voltage pulse is induced on each of the wires which propagates toward the sensed end. While these voltage pulses tend to be about equal, differences in physical and electrical characteristics of the wires and of the information storage states of the cores cause differential voltage pulses to be established between the sense-inhibit line pairs which are substantial in comparison to U1 differential switching signals. As these pulses reach the sense-inhibit lines the termination networks 80, 82 tend to absorb them, but because it is impossible to obtain perfect impedance matching between the termination networks 80, 82 and the sense-inhibit lines $\overline{S2A}$, S2A and S2B, $\overline{S2B}$ respectively, a portion of the differential pulse (as well as any common mode pulses) is reflected back down the sense-inhibit lines toward the inhibit driver end. Upon reaching the inhibit driver end where the two sense-inhibit lines are connected together the differential mode pulses encounter a short circuit and are reflected with very little attenuation back toward the sense end where they are again rereflected after being attenuated by the termination network. However, as these differential mode pulses propagate down the sense-inhibit lines the pairs of anti-parallel Schottky diodes appear as short circuits to differential voltages in excess of the forward bias voltages of the diodes. As a result these excess voltage pulses are reflected upon encountering a pair of diodes prior to reaching the end of a sense-inhibit line. This early reflection causes the voltage pulses to appear on the sense-inhibit lines with a higher frequency at which they are more readily attenuated as the energy thereof is absorbed by the magnetic cores themselves.

It will be apparent to a person of ordinary skill in the art that the 16K bit positions need not be wired by the sense-inhibit wires as if they were two 8K bit positions. As particularly shown in FIG. 2, the sense ends of sense-inhibit wires S2B and $\overline{S2B}$ exit the second bit position proximate the inhibit ends of sense-inhibit windings S2A and $\overline{S2A}$. Thus, by merely connecting the sense end of $\overline{S2B}$ to the inhibit end of S2A and the sense end of S2B to the inhibit end of $\overline{S2A}$, the double 8K sense-inhibit winding arrangement can be transformed into a single 16K sense-inhibit line arrangement. Under such an arrangement the termination network 82 and amplifier 76 may be eliminated. In addition, the inhibit driver need then provide only double the inhibit current since it will be divided only once upon entering the sense-inhibit lines.

Figure 6:
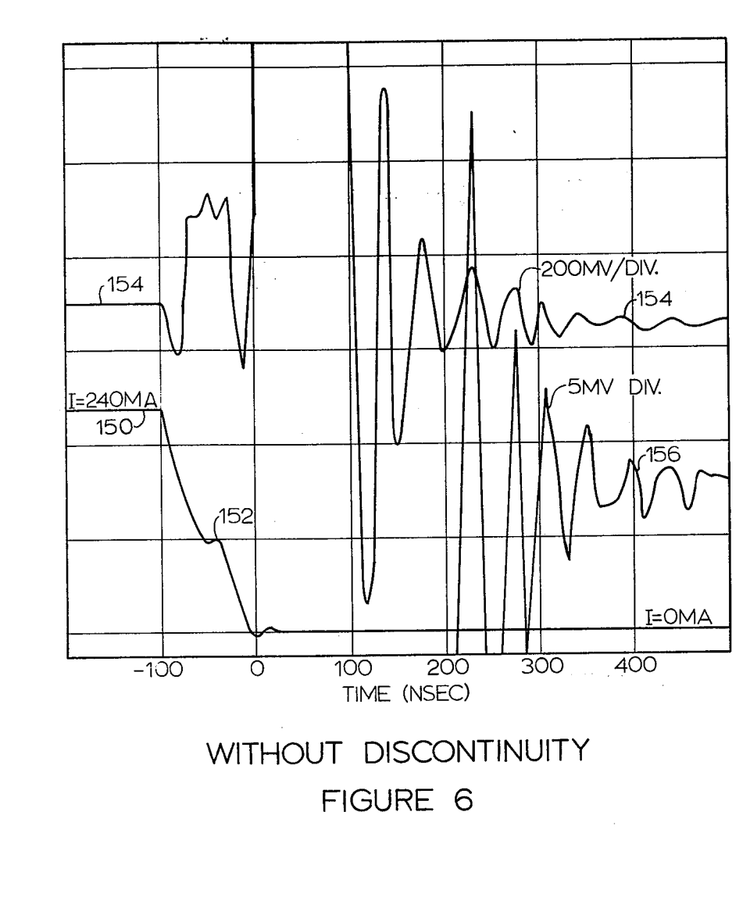
FIG. 6 is a graphical representation of electrical waveforms of a 16K sense-inhibit line pair having no circuitry positioned intermediate a bit position.
Figure 7:
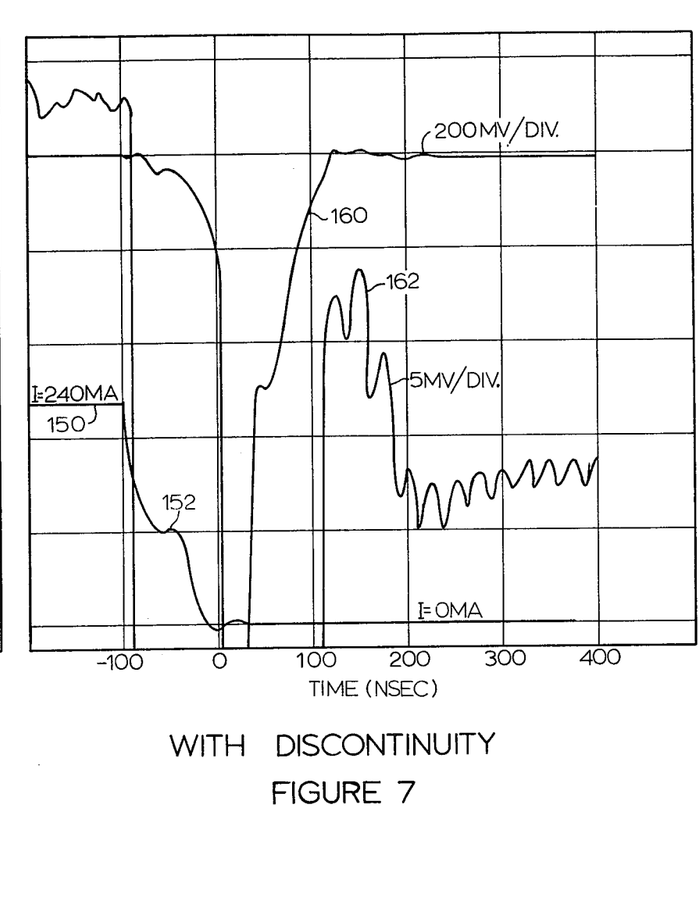
FIG. 7 is a graphical representation of waveforms appearing on 16K sense-inhibit lines of a memory configuration similar to that used to generate the waveforms shown in FIG. 6 when circuit elements are coupled to the sense-inhibit pairs intermediate a bit position in accordance with this invention.

The effective reduction of sense-inhibit recovery time which is obtainable by connecting circuitry to sense-inhibit wires intermediate a bit position is illustrated by FIGS. 6 and 7. The electrical signals which are preferably represented in these figures relate to a 16K, three wire 3D memory driven in a conventional manner. FIG. 6 represents relevant signals with no internal compensation while FIG. 7 represents relevant signals which appear when the sense-inhibit line pairs are interconnected by three pairs of anti-parallel Schottky diodes having a forward bias voltage of approximately 200 millivolts, one pair being positioned at each end of the sense-inhibit lines near the magnetic cores and the third being positioned approximately half way between the other two with half of the cores in the bit position being inductively coupled to the sense-inhibit lines on each side thereof.

Referring particularly to FIG. 6 the sense-inhibit lines are driven with a 240 milliamp inhibit current as represented by curve 150 for a sufficient length of time to attain nearly steady state conditions. At time -100 nsec the inhibit current is terminated and decreases at the rate of 2.4 milliamps per nanosecond for a fall time of 100 nanoseconds. The inhibit current is thus reduced substantially to zero at time zero. It will be noted that a plateau in the inhibit current occurs at position 152 approximately half way through the fall time thereof. This plateau is the result of a high energy common mode electrical pulse reaching the sense end of the sense-inhibit lines and reflecting back to the inhibit end to effect the current through the inhibit driver. The differential voltage which appears across the sense-inhibit conductors at the sense end thereof is shown at two different horizontal axes for two different amplification scales. A curve 154 represents the differential mode signals with an amplification of 200 millivolts per division while a curve 156 represents the difference mode signals with am amplification of 5 millivolts per division. It can be seen by observing curve 154 that large magnitude high frequency voltage differential pulses appear across the sense-inhibit lines as the inhibit current begins to fall. Because the output switching signal for the switching of a core from a 1 state to a 0 state during a subsequent read cycle will have a peak magnitude of only 40 millivolts, the subsequent read cycle cannot occur until the differential voltage pulses on the sense-inhibit lines are attenuated to a peak-to-peak magnitude of 5 millivolts or less. It can be seen from curve 156 that approximately 340 nanoseconds are required for the inhibit current termination voltage pulses to be attenuated to this level. It can also be observed that slightly less than 50 nanoseconds are required for the occurrence of two successive peaks in the differential voltage pulses. These pulses thus have a frequency slightly in excess of 20 MHz.

Referring particularly now to FIG. 7, the presence of the anti-parallel pairs of diodes has a substantial effect on the differential mode pulses appearing at the sense ends of the sense-inhibit lines. A curve 160 representing differential voltages with a scale of 200 millivolts per division shows that high frequency oscillations have been greatly attenuated. A large magnitude negative voltage pulse is generated as the inhibit current is turned off but the magnitude of this voltage pulse is rapidly attenuated. A curve 162 represents the differential voltage at an amplified scale of 5 millivolts per division and shows that only about 190 nanoseconds are required for the differential voltage signal to be attenuated below a peak-to-peak magnitude of 5 millivolts when the anti-parallel pairs of Schottky diodes are connected to the sense-inhibit lines. This is 150 nanoseconds less than the 340 nanoseconds required for adequate attenuation when no Schottky diodes are employed. In addition, it can be seen by observing curve 162 that the frequency of the voltage pulse oscillations has been approximately doubled to about 40 MHz. This is consistent with an approximate halving of the transmission line distance between significant discontinuities on the sense-inhibit line pair. It is thought that the presence of the discontinuity causes generation of even higher frequency harmonics which are even more rapidly absorbed by the magnetic cores and do not attain sufficient magntiude to materially affect the sensed differential signals.

While there have been described above particular arrangements of core memories with improved sense-inhibit recovery times in accordance with the invention, it will be appreciated that the invention is not limited thereto. Accordingly, any variations, modifications, or equivalent arrangements within the scope of the appended claims should be considered to be within the scope of the invention.

What is claimed is:

1. A magnetic core memory comprising at least one array of magnetic cores;

a plurality of conductors inductively coupled for selectively switching cores in the array and for sensing output voltage signals generated by selectively switched cores;

a sense amplifier coupled to at least one of said conductors to sense output voltage signals generated thereon by selectively switched cores; and a non-linear electrical circuit connected to the at least one conductor to modify electric signals appearing thereon, said electrical circuit being connected to the one conductor at a position intermediate the array with the one conductor being inductively coupled to magnetic cores of the array on each side of the connection position and with magnetic cores inductively coupled to the conductor on at least one side of the connection being disposed along the conductor between the connection position and the sense amplifier, said conductor being coupled to carry current between a current source and a current sink with a connection position and cores inductively coupled to the conductor on both sides thereof being disposed between the current source and current sink.

2. The magnetic core memory as set forth in claim 1 above, wherein said electrical circuit has a nonlinear threshold characteristic and presents a transmission line discontinuity to high frequency electrical signals appearing on the one conductor with a magnitude in excess of the threshold while having a minimal effect upon electrical signals appearing on the one conductor with a magnitude less than the threshold.

3. The magnetic core memory as set forth in claim 1 above, wherein said electrical circuit has a nonlinear threshold voltage characteristic and presents a transmission line discontinuity to electrical signals appearing on the one conductor with a voltage magnitude in excess of the threshold voltage while having substantially no effect upon electrical signals appearing upon the one conductor with a voltage magnitude less than the threshold voltage.

4. The magnetic core memory as set forth in claim 3 above, wherein said electrical circuit includes at least one Schottky diode.

5. The magnetic core memory as set forth in claim 3 above, wherein said electrical circuit includes a nonlinear circuit element having a series capacitance of less than 2 pico farads.

6. The magnetic core memory as set forth in claim 3 above, wherein the threshold voltage of said circuit element is not greater than approximately 200 millivolts.

7. The magnetic core memory as set forth in claim 3 above, wherein said one conductor is a sense-inhibit conductor selectively carrying an inhibit current to inhibit the switching of a core in the array during a memory write cycle and carrying an output switching signal generated by the switching of flux in a selected core during a memory read cycle.

8. The magnetic core memory as set forth in claim 7 above, wherein said one conductor inductively couples approximately half of the cores in the array, wherein said plurality of conductors includes a second sense-inhibit conductor inductively coupling substantially all of the cores in the array not coupled by the one conductor in a manner providing an electrical balance between the one and second conductor, and wherein the electrical circuit is coupled between the one and second conductors.

9. The magnetic core memory as set forth in claim 8 above, wherein the electrical circuit includes a pair of anti-parallel Schottky diodes.

10. A three wire three dimensional core memory comprising:

a plurality of mats, each including an array of at least 2048 magnetic memory cores and providing memory for one bit position of a multibit addressed memory word;

a plurality of drive conductors coupled to selectively switch one core in each mat at an addressed memory location;

a pair of sense-inhibit conductors for each mat, the two conductors of each pair being connected together at one end and inductively coupled to an approximately equal number of cores from the mat, the conductors being in close physical proximity to each other at at least one point intermediate the mat equidistant along the conductors from the point of connection together and being inductively coupled to cores on each side of the point of close proximity;

a plurality of electronic circuits, each being connected between a pair of sense-inhibit conductors at a point of close proximity and blocking the communication thereacross of components of differential core switching signals below a threshold magnitude sufficient to permit the detection of core switching signals on the sense-inhibit conductors while permitting the communication thereacross of components of differential signals greater than the threshold magnitude; and a plurality of sensing circuits, each sensing circuit being connected to sense differential core switching signals appearing across a different pair of conductors at the ends thereof opposite the point of connection.

11. The core memory as set forth in claim 10 above, wherein each electronic circuit provides a capacitive coupling between the conductors connected thereto of not more than 2 pico-farads.

12. The memory as set forth in claim 11 above, wherein each electronic circuit comprises a pair of anti-parallel Schottky diodes.

13. The core memory as set forth in claim 10 above, wherein each of the plurality of mats includes at least 16,000 memory cores.

14. For use in a magnetic memory having approximately balanced pairs of conductors inductively coupled to memory elements between drive ends and sink ends and which conduct approximately equal common mode signals some times between the drive ends and sink ends and conduct differential mode signals at other times, a device for increasing the attenuation rate of differential signals appearing across equivalent points along the conductors upon termination of common mode signals comprising at least one electrical circuit coupled between equivalent points along the pair of conductors with memory elements disposed along the conductors between the equivalent points and sink ends, the circuit including means for blocking the conduction through the circuit of at least a component of a differential mode signal which is below a selected threshold of at least 20 millivolts during at least a part of said other times and conducting at least a component of a differential mode signal which is above a selected threshold during at least a part of said some times.

15. The device as set forth in claim 14 above, wherein the electrical circuit has a series capacitance of not more than 3 picofarads when conducting current.

16. The device as set forth in claim 14 above, wherein the electrical circuit includes a pair of antiparallel Schottky diodes.

17. A core memory stack comprising:
an array of magnetic storage elements;
drive conductors inductively coupled to selectively switch magnetic storage elements in the array;
a pair of sense-inhibit conductors, each inductively coupling approximately half of the storage elements in the array; and
at least one threshold signal level transmission line discontinuity element electrically connected to both of the sense-inhibit conductors at a position therealong intermediate the array and appearing as a transmission line discontinuity to voltage signals in excess of the threshold but having substantially no effect on storage element induced switching signals less than the threshold.

18. A core memory comprising:
a plurality of magnetic cores;
a drive system inductively coupled to drive first selected cores with magnetomotive forces of sufficient magnitude to induce switching;
a pair of sense-inhibit conductors inductively coupled to selectively oppose the switching of first selected cores and generate a differential voltage across a pair of terminals of the pair of sense-inhibit conductors in response to the switching of a first selected core;
a current driver, connected to selectively drive first terminals of the pair of sense-inhibit conductors with substantially equal parallel currents;
a differential sense amplifier coupled to sense differential voltages across terminals of the pair of sense-inhibit conductors and generate an output signal indicative thereof; and
a non-linear electrical circuit electrically disposed intermediate the cores and interconnecting the pair of sense-inhibit conductors at approximately equal distances along the conductors from the first terminals thereof, the electrical circuit appearing as an open circuit to differential voltage signals below a threshold value sufficient to permit sensing of an output signal generated by the switching of a core and appearing as a substantially short circuit between the sense-inhibit conductors to differential voltages greater than the threshold.

19. The core memory as set forth in claim 18 above, wherein the sense amplifier is connected to sense differential voltages across second terminals of the sense-inhibit conductors opposite the first terminals thereof.

20. The core memory as set forth in claim 18 above, wherein the nonlinear electrical circuit includes at least one Schottky diode having a small capacitance and a low forward threshold voltage.

21. The core memory as set forth in claim 18, wherein memory cores are inductively coupled along each of the sense-inhibit conductors between the points of connection of each sense-inhibit conductor to a non-linear electrical circuit and the sense amplifier.

22. In a magnetic memory having pairs of conductors alternately carrying high energy memory state control signals and lower energy differential switching signals the improvement comprising at least one circuit connected between each pair of said conductors at corresponding positions partway therealong including means for increasing the attenuation of differential components of high energy control signals appearing thereacross while having substantially no effect on at least a low energy component of the differential switching signals sufficient to permit detection thereof.

23. A core memory comprising:
an array of magnetic cores which are switchable between stable states of magnetization;
a plurality of drive conductors inductively coupled to selectively switch cores in the array between stable states of magnetization;
first and second sense-inhibit conductors, each being inductively coupled to approximately half of the cores in the array, the first and second sense-inhibit conductors being coupled to carry approximately balanced current for inhibiting the switching of a core in the array and subsequently to carry a differential voltage therebetween which is induced by the switching of a core inductively coupled to a sense-inhibit conductor;
means for sensing coupled to sense core switching signals induced differentially between the first and second sense-inhibit conductors; and
noise reduction circuitry coupled between the first and second sense-inhibit conductors at corresponding positions therealong having magnetic cores disposed between the points of connection of the noise reduction circuitry and the sensing means, the noise reduction circuitry including means for decreasing the time period required to attenuate differential noise signals which are induced on the first and second conductors by the inhibit currents and which interfere with the detection of the switching of a core, to a magnitude which does not prevent the sensing means from sensing core switching signals.

24. A magnetic core memory comprising:
at least one array of magnetic cores;
a differential voltage sensing circuit having differential inputs;
means for selectively switching the cores in the array;

means for sensing output voltage signals generated by selectively switched cores, the switching and sensing means including first and second conductors which are inductively coupled to a plurality of cores in the array and which are coupled to differential inputs of the sensing circuit; and an electrical circuit connected to at least a first of said first and second conductors at a connection point having at least one memory core inductively coupled to the at least a first of said conductors between the connection point and the differential sensing circuit, the electrical circuit including means for interfering with the passage along the conductor past the connection point of large magnitude signals relative to a similar point on the other conductor of the first and second conductors having approximately the same number of memory cores between the similar point and the differential sensing circuit without substantial interference with the subsequent passage of a differential signal induced on the conductor by the switching of a magnetic core.

* * * * *